United States Patent
Yee et al.

(10) Patent No.: US 7,203,613 B1
(45) Date of Patent: Apr. 10, 2007

(54) IC ANALOG DEBUGGING AND CALIBRATION THEREOF

(75) Inventors: Gin S. Yee, Sunnyvale, CA (US); Claude R. Gauthier, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/830,881

(22) Filed: Apr. 23, 2004

(51) Int. Cl.
*G01R 31/00* (2006.01)

(52) U.S. Cl. ..................................... 702/106
(58) Field of Classification Search ............ 702/106, 702/117, 118, 85
See application file for complete search history.

(56) References Cited

U.S. PATENT DOCUMENTS 6,111,533 A * 8/2000 Yuan et al. .................. 341/157
6,969,652 B2 * 11/2005 Knoedgen .................. 438/258
2001/0020875 A1 * 9/2001 Jansson ........................ 331/44
2002/0060638 A1 * 5/2002 Nishii et al. ................. 341/157

* cited by examiner

*Primary Examiner*—John Barlow
*Assistant Examiner*—Demetrius Pretlow
(74) *Attorney, Agent, or Firm*—Osha-Liang LLP

(57) ABSTRACT

An analog debugging block of an integrated circuit includes a multiplexor, a buffer, and a voltage-controlled oscillator. An analog voltage signal-of-interest is selectively passed through the multiplexor to the buffer. The buffer outputs an analog control voltage dependent on the selected analog voltage signal-of-interest. The analog control voltage serves as an input to the voltage-controlled oscillator and is used to control a frequency of a digital output signal generated from the voltage-controlled oscillator. The digital output signal from the voltage-controlled oscillator is driven off-chip, whereupon a frequency of the digital output signal is determined and compared against a collection of known frequencies that correspond to particular known voltages of the analog voltage signal-of-interest, thereby resulting in a determination of the value of the selected analog voltage signal-of-interest.

18 Claims, 6 Drawing Sheets

IC ANALOG DEBUGGING AND CALIBRATION THEREOF

BACKGROUND OF INVENTION

A typical computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media, e.g., a floppy disk or a CD-ROM (not shown). The computing portion 12, using memory and other internal components, processes both internal data and data provided to the computing portion 12 by the user to generate data requested by the user. The generated data may be provided to the user via, for example, a display device 18 or a printer 20.

The computing portion 12 of a computer system typically includes various components such as, for example, a power supply, disk drives, and the electrical circuitry required to perform the necessary and requested operations of the computer system. As shown in FIG. 2, the computing portion 12 may contain a plurality of circuit boards 22, 24, 26, 28 on which various circuit components are implemented. For example, a computing portion designed to have enhanced sound reproducing capabilities may have a circuit board dedicated to implementing high-performance circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, and digital logic chips) that are connected onto the circuit board 22. The integrated circuits 32, 34, 36, 38, 40, 42 communicate with one another, i.e., pass data, using wires or traces of conductive material (e.g., copper) (shown, but not labeled) embedded in the circuit board 22.

SUMMARY OF INVENTION

According to one aspect of one or more embodiments of the present invention, a computer system having an integrated circuit comprises: a multiplexor arranged to selectively pass an analog voltage signal to an output of the multiplexor; a voltage-controlled oscillator having an input dependent on the output of the multiplexor, where the voltage-controlled oscillator is arranged to output a digital output signal, and where a frequency of the digital output signal is dependent on the input of the voltage-controlled oscillator; and a wire arranged to propagate the digital output signal to an input/output terminal of the integrated circuit.

According to another aspect of one or more embodiments of the present invention, a computer system comprises: means for selecting an analog voltage signal for debugging; means for generating a digital signal, where a frequency of the digital signal is dependent on the analog voltage signal; and means for propagating the digital signal off-chip.

According to another aspect of one or more embodiments of the present invention, a method for debugging an analog voltage signal comprises: selecting the analog voltage signal; propagating the analog voltage signal; generating a digital signal, wherein a frequency of the digital signal is dependent on the analog voltage signal; and driving the digital signal off-chip.

Other aspects and advantages of the invention will be apparent from the following description and the appended claims.

DETAILED DESCRIPTION

Figure 1:
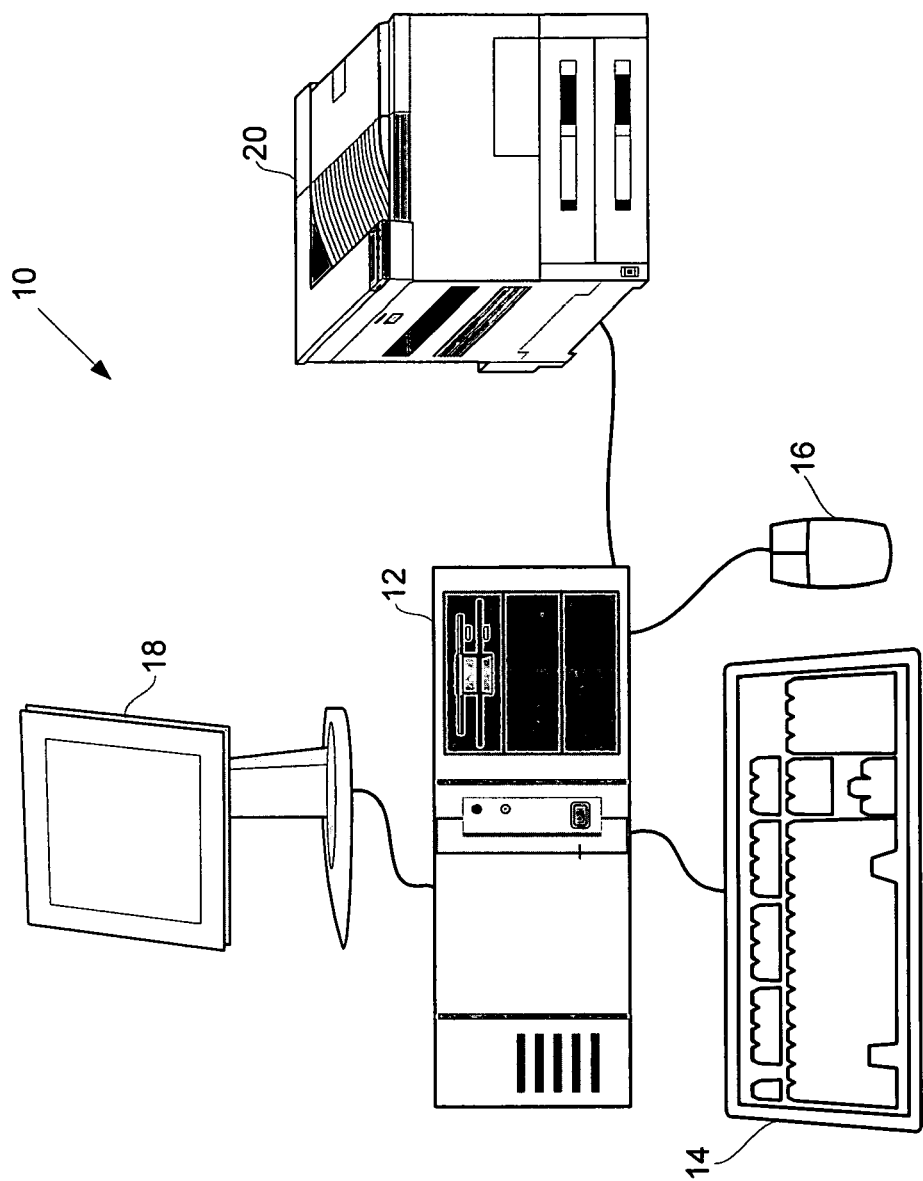
FIG. 1 shows a typical computer system.
Figure 2:
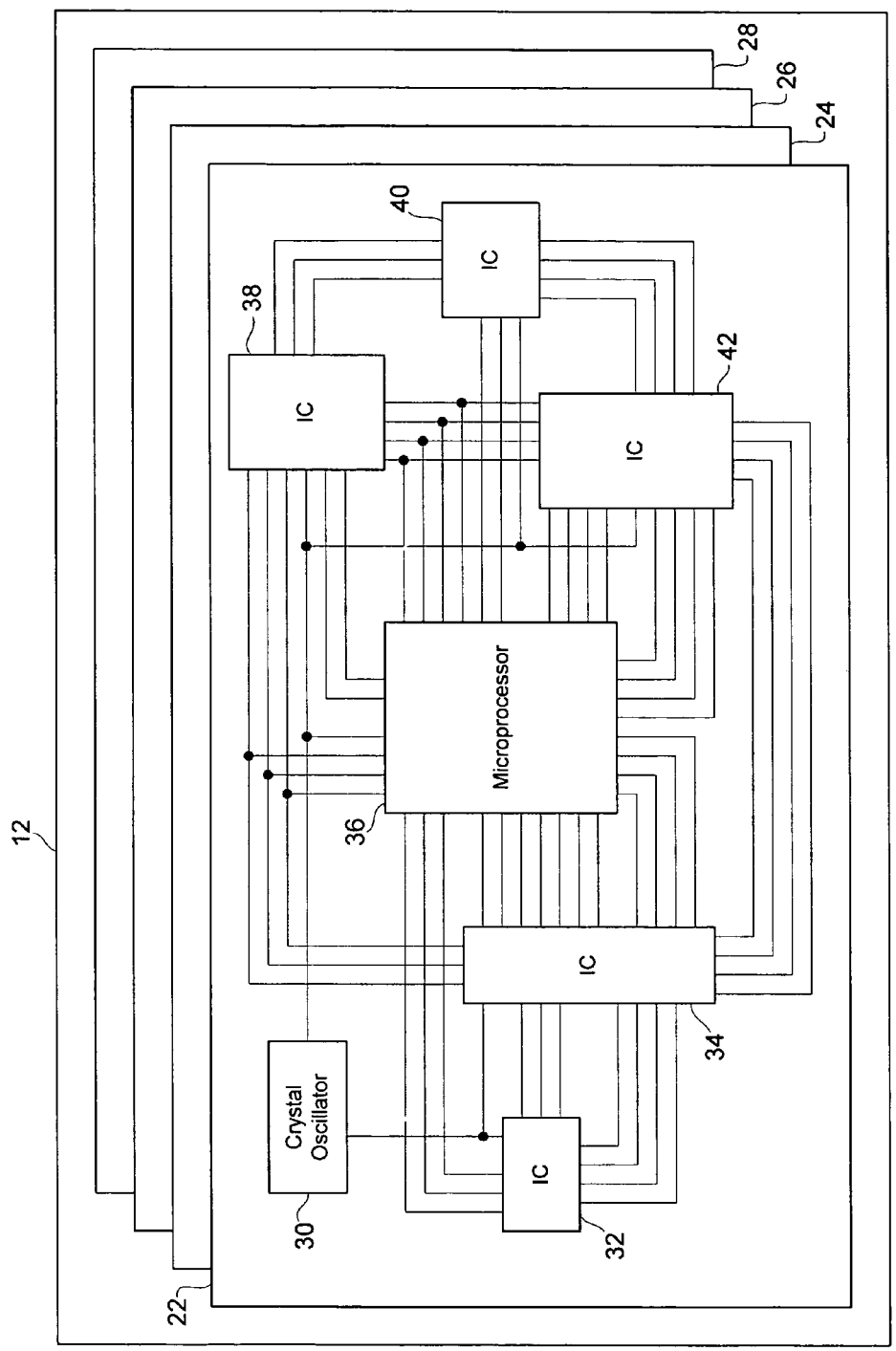
FIG. 2 shows components of a typical computer system.

Once an integrated circuit, such as one shown in FIG. 2, is fabricated, it is often necessary to find currently or potentially problematic circuits of the integrated circuit. Finding circuit problems in post-fabrication (i.e., "post-silicon") designs is referred to and known in the art as circuit "debugging."

Typical debugging involves, for example, intrusive physical probing of a signal-of-interest in the integrated circuit and/or driving a signal-of-interest off-chip (i.e., outputting the signal-of-interest from the integrated circuit via an input/output terminal of the integrated circuit) for subsequent measurement. However, driving an analog voltage signal off-chip (as opposed to driving a digital voltage signal off-chip) introduces error into the subsequent measurement because the analog voltage signal loses integrity when it is driven off-chip.

Figure 3:
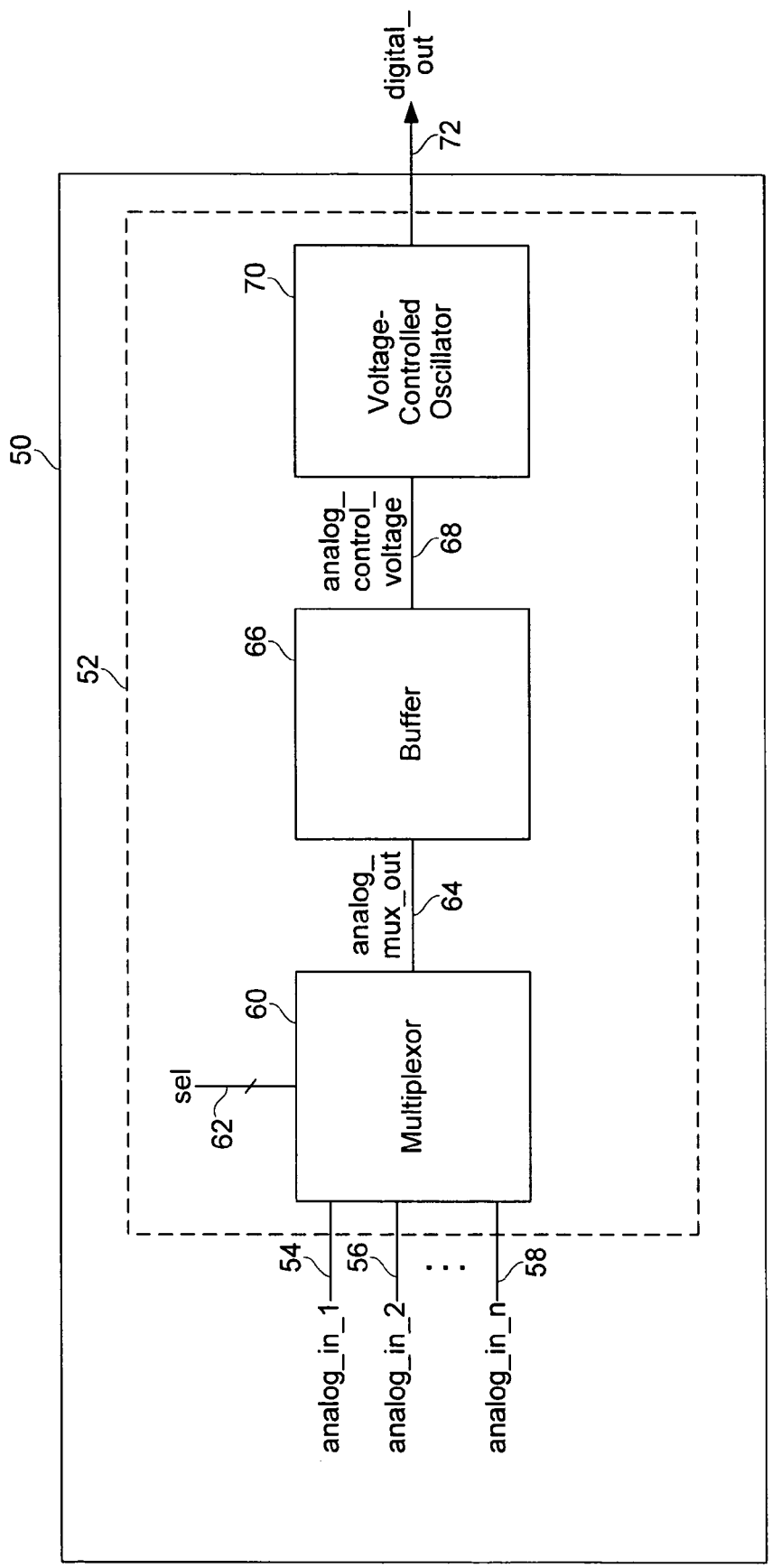
FIG. 3 shows an analog debugging block of an integrated circuit in accordance with an embodiment of the present invention.

Embodiments of the present invention relate to an integrated circuit analog debugging technique that substantially reduces errors that would otherwise be introduced when driving an analog voltage signal off-chip. FIG. 3 shows an exemplary integrated circuit 50 having an analog debugging block 52 in accordance with an embodiment of the present invention.

The analog debugging block 52 inputs a plurality of analog voltage signals-of-interest analog_in_1 54, analog_in_2 56, and analog_in_n 58. The analog voltage signals-of-interest 54, 56, and 58 serve as inputs to a multiplexor 60 that selects for passing one of the analog voltage signals-of-interest 54, 56, and 58 dependent on a select input 62 to the multiplexor 60. The selected analog voltage signal is passed to an output signal analog_mux_out 64 of the multiplexor 60.

The output signal 64 from the multiplexor 60 serves as an input to a buffer 66, which, in turn, outputs an analog control voltage analog_control_voltage 68 to a voltage-controlled oscillator 70. The analog control voltage 68 controls a frequency of a digital output signal digital_output 72 generated from the voltage-controlled oscillator 70. This digital output signal 72 is driven off-chip using a wire that connects an output of the voltage-controlled oscillator 70 to an input/output terminal (i.e., a pin) of the integrated circuit 50.

Those skilled in the art will recognize that driving the digital output signal 72 off-chip is "safer" than driving an analog voltage signal off-chip because the digital output signal 72 has digital levels and is isolated from an analog source.

Once the frequency of the digital output signal 72 is measured, an analog voltage corresponding to that frequency is determined using a collection (e.g., a look-up table) of known corresponding analog voltages and frequencies. For example, if it is known from pre-fabrication simulation results, that, in an analog debugging process using the analog debugging block 52, an analog voltage signal-of-interest having of 2.34 volts will cause the digital output signal 72 to have a 350 MHz frequency, then a post-fabrication measurement of the digital output signal frequency may then be used to determine an actual voltage of the analog voltage signal-of-interest.

In order to calibrate analog debugging measurements using the analog debugging block 52, a known analog voltage may be supplied to an input of the multiplexor 60 and selected for passing through the multiplexor 60. By comparing a frequency of the resulting digital output signal 72 with a known frequency of the digital output signal 72 that corresponds to the known analog voltage, one skilled in the art will be able to calibrate the relationships between known frequencies corresponding to particular analog voltages. In other embodiments of the present invention, the frequency on the digital output signal 72 resulting from the application of a known analog voltage may itself be used as a baseline or initial relationship by which future measurements are compared.

In one or more embodiments of the present invention, the known voltage may be supplied based on an input signal to the integrated circuit on which the analog debugging block 52 is disposed. In other words, the known voltage may be present on a signal that is driven on-chip.

Figure 4:
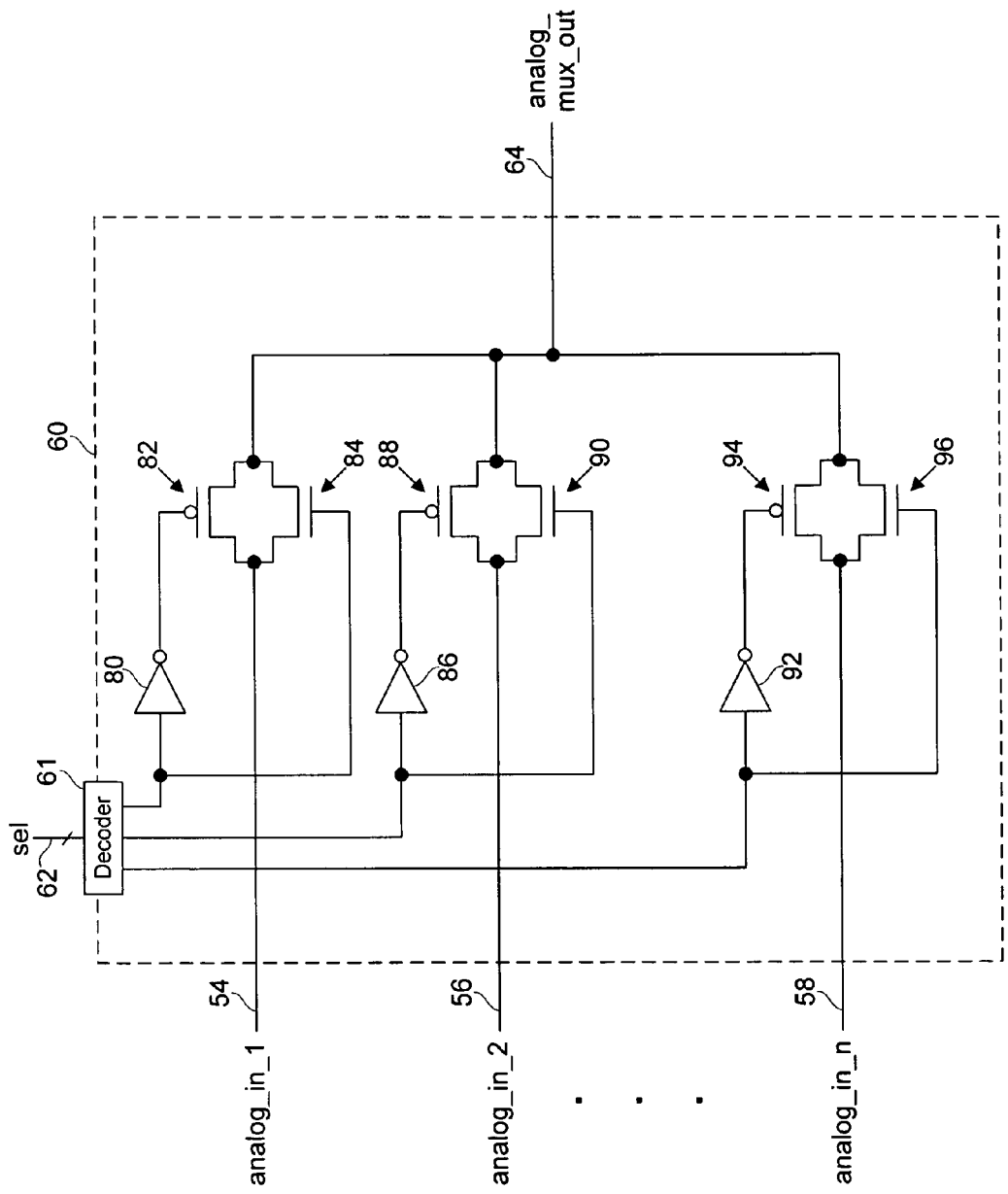
FIG. 4 shows a multiplexor of an analog debugging block in accordance with an embodiment of the present invention.

FIG. 4 shows an exemplary multiplexor 60 of a analog debugging block in accordance with an embodiment of the present invention. Analog voltage signals 54, 56, and 58 respectively serve as inputs to pass gates respectively formed of transistors 82 and 84, transistors 88 and 90, and transistors 94 and 96. The pass gates are controlled by decoded bits (by decoder 61) of the select input 62 (also using inverters 80, 86, and 92 to appropriately generate a complement of a decoded bit of the select input 62) so as to allow, when desired, one of the analog voltage signals 54, 56, and 58 to pass from an input of the pass gate associated with the selected analog voltage signal to an output of the associated pass gate, which, in turn, propagates the selected analog voltage signal to the output signal 64 of the multiplexor 60.

Figure 5:
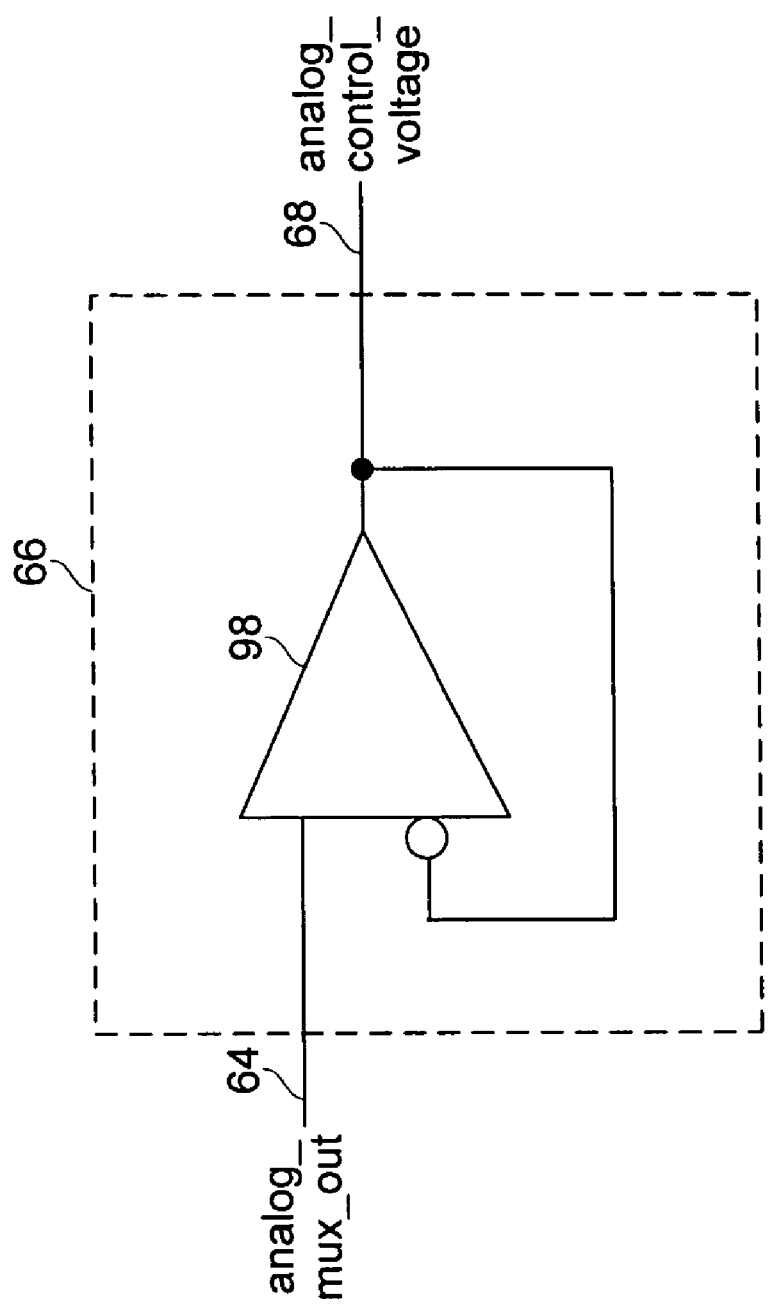
FIG. 5 shows a buffer of an analog debugging block in accordance with an embodiment of the present invention.

FIG. 5 shows an exemplary buffer 66 of an analog debugging block in accordance with an embodiment of the present invention. The output signal 64 from the multiplexor 60 serves as an input to an operational amplifier 98 of the buffer 66, which, in turn, outputs the analog control voltage 68. The analog control voltage 68, in addition to serving as an output of the buffer 66, is fed back to an inverting input of the operational amplifier 66.

Figure 6:
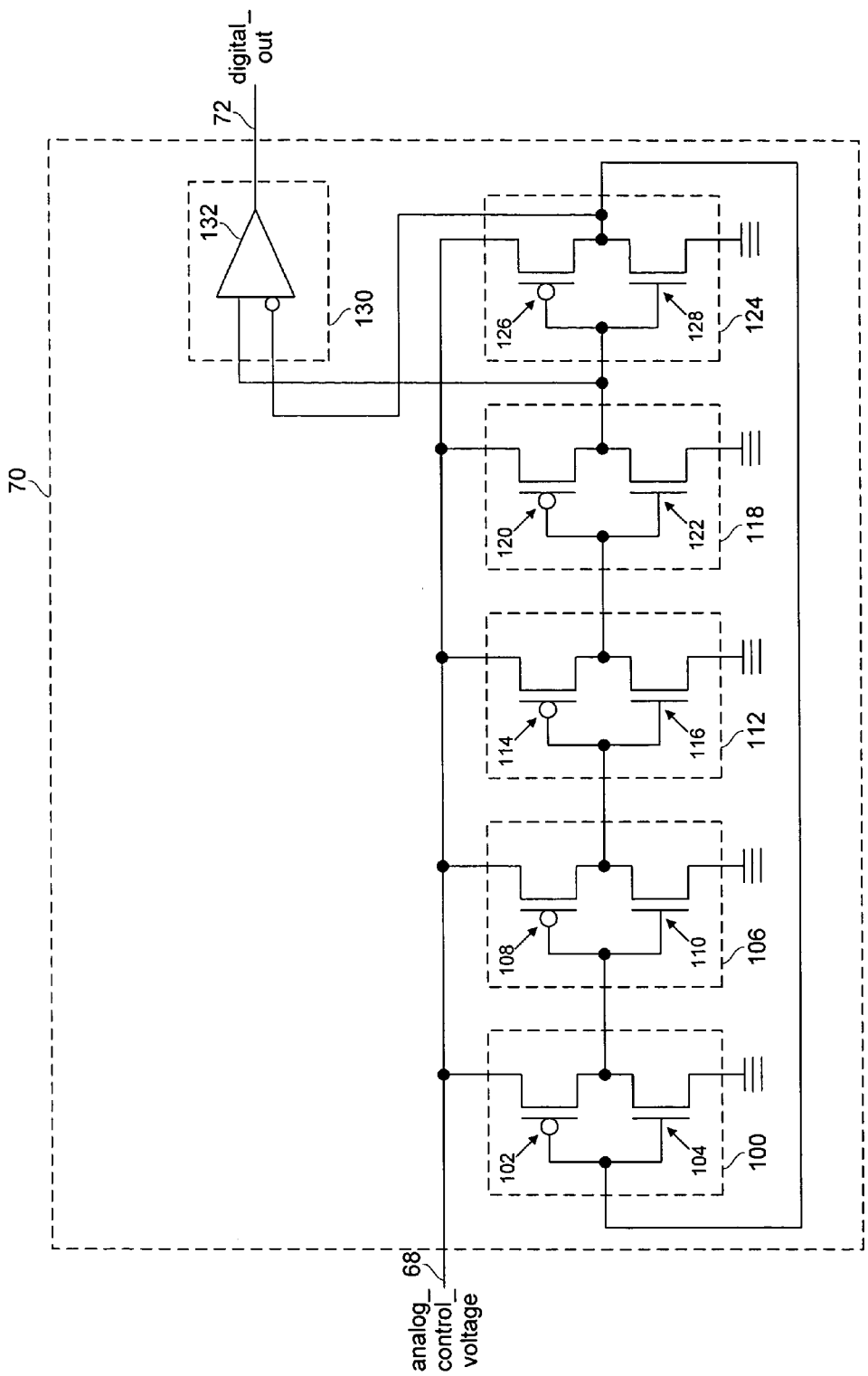
FIG. 6 shows a voltage-controlled oscillator of an analog debugging block in accordance with an embodiment of the present invention.

FIG. 6 shows an exemplary voltage-controlled oscillator 70 of an analog debugging block in accordance with an embodiment of the present invention. The analog control voltage 68 is connected to a plurality of inverters 100 (formed by transistors 102 and 104), 106 (formed by transistors 108 and 110), 112 (formed by transistors 114 and 116), 118 (formed by transistors 120 and 122), and 124 (formed by transistors 126 and 128). Particularly, the analog control voltage 68 serves as a power supply voltage of the inverters 100, 106, 112, 118, and 124, thereby controlling propagation delays of the inverters 100, 106, 112, 118, and 124.

An output buffer 130 formed by an operational amplifier 132 inputs the output of inverter 118 and the output of inverter 124. The output buffer 130, in turn, outputs the digital output signal 72. Because the analog control voltage 68 controls the propagation delays of the inverters 100, 106, 112, 118, and 124, a frequency of the digital output signal 72 is dependent on the analog control voltage 68. For example, a relatively high analog control voltage 68 may result in the digital output signal 72 having a relatively high frequency.

In one or more embodiments of the present invention, the voltage-controlled oscillator 70 may be designed to have a very high input impedance, thereby ensuring that the analog current voltage 68 is not corrupted by the sinking/sourcing of current from/to the analog current voltage 68 by components of the voltage-controlled oscillator 70.

Advantages of the present invention may include one or more of the following. In one or more embodiments, because an analog debugging process involves driving a digital voltage signal off-chip instead of driving an analog voltage signal off-chip, precise measurements of an analog voltage signal-of-interest may be obtained.

In one or more embodiments, only one input/output terminal (i.e., one pin) of an integrated circuit is required for an analog debugging process using an analog debugging block in accordance with the present invention.

In one or more embodiments, an analog debugging block may be calibrated so as to compensate for errors introduced in a determination of an analog voltage signal value.

In one or more embodiments, an analog debugging block may be calibrated so at to compensate for variations (e.g., process, voltage, and temperature variations) experienced by components of the analog debugging block.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system having an integrated circuit, the integrated circuit comprising:
    a multiplexer arranged to selectively pass an analog voltage signal to an output of the multiplexer;
    a buffer arranged to generate an analog control voltage dependent on the output of the multiplexer;
    a voltage-controlled oscillator having an input dependent on the analog control voltage, the voltage-controlled oscillator being arranged to output a digital output signal, wherein a frequency of the digital output signal is dependent on the input of the voltage-controlled oscillator; and
    a wire arranged to propagate the digital output signal to an input/output terminal of the integrated circuit.

2. The computer system of claim 1, wherein the analog voltage signal has a known voltage.

3. The computer system of claim 1, wherein the analog voltage signal is dependent on an input signal to the integrated circuit.

4. The computer system of claim 1, the multiplexer comprising:
    a pass gate that is controlled to selectively propagate the analog voltage signal from an input of the pass gate to an output of the pass gate.

5. The computer system of claim 4, wherein the output of the pass gate is connected to the output of the multiplexer.

6. The computer system of claim 1, wherein the buffer comprises an operational amplifier.

7. The computer system of claim 6, wherein the analog control voltage is connected to an inverting input of the operational amplifier.

8. The computer system of claim 1, the voltage-controlled oscillator comprising:
   an inverter having a propagation delay that is controlled by the input to the voltage-controlled oscillator.

9. The computer system of claim 1, wherein the multiplexer is arranged to selectively pass the analog voltage signal dependent on a select input to the multiplexer.

10. A computer system, comprising:
    means for selecting and outputting an analog voltage signal for debugging using a multiplexer;
    means for arranging a buffer to generate an analog control voltage dependent on the selected and outputted analog voltage signal;
    means for generating a digital signal, wherein a frequency of the digital signal is dependent on the analog control voltage; and
    means for propagating the digital signal off-chip.

11. The computer system of claim 10, wherein the means for generating the digital signal is dependent on the analog control voltage.

12. The computer system of claim 10, wherein the analog voltage signal has a known voltage.

13. The computer system of claim 10, the means for selecting comprising:
    means for passing the analog voltage signal dependent on a select input to the means for selecting.

14. The computer system of claim 10, the means for generating the digital signal comprising:
    means for inverting a signal, wherein a propagation delay of the means for inverting is dependent on the analog voltage signal, and wherein the digital signal is dependent on the signal inverted by the means for inverting.

15. A method for debugging an analog voltage signal, comprising:
    selecting and outputting the analog voltage signal using a multiplexer;
    propagating the selected and outputted analog voltage signal to a buffer;
    generating an analog control voltage dependent on the selected and outputted analog voltage signal using the buffer;
    propagating the analog control voltage to a voltage controlled oscillator;
    generating a digital signal in the voltage controlled oscillator, wherein a frequency of the digital signal is dependent on the analog control voltage; and
    propagating the digital signal off-chip.

16. The method of claim 15, further comprising:
    measuring the frequency of the digital signal; and
    comparing the measured frequency to a known frequency, wherein the known frequency corresponds to a particular value of the analog voltage signal.

17. The method of claim 15, wherein the analog voltage signal has a known voltage, the method further comprising:
    measuring the frequency of the digital signal; and
    calibrating the analog voltage signal dependent on the measured frequency.

18. The method of claim 15, the generating comprising:
    inverting a signal, wherein a propagation delay of the inverting is dependent on the analog voltage signal, and wherein the digital signal is dependent on the inverted signal.

* * * * *